(12) United States Patent
Gorshe

(10) Patent No.: US 8,639,995 B1
(45) Date of Patent: Jan. 28, 2014

(54) SYSTEMS AND METHODS FOR SIGNATURE CIRCUITS

(75) Inventor: Steven Scott Gorshe, Beaverton, OR (US)

(73) Assignee: PMC-Sierra, Inc., Sunnyvale, CA (US)

( * ) Notice: Subject to any disclaimer, the term of this patent is extended or adjusted under 35 U.S.C. 154(b) by 1023 days.

(21) Appl. No.: 12/704,406

(22) Filed: Feb. 11, 2010

Related U.S. Application Data

(62) Division of application No. 12/250,350, filed on Oct. 13, 2008, now abandoned, which is a division of application No. 11/096,293, filed on Apr. 1, 2005, now Pat. No. 7,437,641.

(60) Provisional application No. 60/558,713, filed on Apr. 1, 2004.

(51) Int. Cl.
*G06F 11/00* (2006.01)

(52) U.S. Cl.
USPC .......................................... 714/738; 714/742

(58) Field of Classification Search
USPC ................................................. 714/742, 738
See application file for complete search history.

(56) References Cited

U.S. PATENT DOCUMENTS

| | | | | |
|---|---|---|---|---|
| 4,216,374 A | * | 8/1980 | Lam et al. | 714/744 |
| 4,580,274 A | * | 4/1986 | Debany et al. | 375/228 |
| 5,617,531 A | * | 4/1997 | Crouch et al. | 714/30 |
| 5,631,913 A | | 5/1997 | Maeda | |
| 5,677,913 A | * | 10/1997 | Aybay | 714/720 |
| 5,929,650 A | * | 7/1999 | Pappert et al. | 324/750.3 |
| 5,938,784 A | | 8/1999 | Kim | |
| 5,960,009 A | | 9/1999 | Gizopoulos et al. | |
| 6,247,154 B1 | | 6/2001 | Bushnell et al. | |
| 6,681,357 B2 | * | 1/2004 | Pendurkar | 714/732 |
| 6,701,476 B2 | | 3/2004 | Pouya et al. | |
| 6,715,105 B1 | | 3/2004 | Rearick | |
| 6,920,604 B2 | | 7/2005 | Coakeley et al. | |
| 6,950,974 B1 | | 9/2005 | Wohl et al. | |
| 7,228,474 B2 | * | 6/2007 | Williams et al. | 714/726 |
| 2002/0184582 A1 | | 12/2002 | Pouya et al. | |
| 2002/0184586 A1 | | 12/2002 | Pendurkar | |
| 2006/0179393 A1 | | 8/2006 | Harter et al. | |
| 2007/0245133 A1 | | 10/2007 | Weiberle et al. | |

FOREIGN PATENT DOCUMENTS

JP  2002-243805  8/2002

OTHER PUBLICATIONS

Abramovici, M et al., "Digital Systems Testing and Testable Design," 1990, Computer Science Press, New York, pp. 421-449.
Hayes, J. P., "Check Sum Test Methods," Proceedings of Fault Tolerant Computing Symposium, 1976, pp. 114-120.

(Continued)

*Primary Examiner* — M. Mujtaba K Chaudry
(74) *Attorney, Agent, or Firm* — Knobbe Martens Olson & Bear LLP

(57) ABSTRACT

Signature circuits are used during testing of an integrated circuit. Test vectors are applied as inputs to a circuit under test. A signature circuit stores a "signature" for the circuit under test based on a combination of signals from the circuit under test in response to test vectors and a previous stored state of the signature register. The value contained in the signature register at the end of the test is the signature. A fault-free circuit generates a particular signature for the applied test vectors. Faults can be determined by detecting variances from the expected signature. In one embodiment, the signature circuit uses a combination of two error detection codes.

12 Claims, 4 Drawing Sheets

(56) References Cited

OTHER PUBLICATIONS

Chandra, A., et al., "Systems-on-a-Chip Test-Data Compression and Decompression Architectures Based on Golomb Codes," IEEE Transactions on Computer-Aided Design, Mar. 2001, pp. 355-368, vol. 20, No. 3.

Chakrabarty, K., et al., "Test Response Compaction Using Multiplexed Parity Trees," IEEE Transactions on Computer-Aided Design, Nov. 1996, pp. 1399-1408, vol. 15, No. 11.

Reddy, S.M., et al., "A Data Compression Technique for Built-In Self Test," IEEE Transactions on Computers, Sep. 1998, pp. 1151-1156, vol. 37, No. 9.

Chakrabarty, K., et al., "Optimal Space Compaction of Test Responses," Proceedings of International Test Conference, 1995, pp. 834-843.

Saxena, N., et al., "Syndrome and Transition Count are Uncorrelated," IEEE Transactions on Information Theory, Jan. 1988, pp. 64-69, vol. 34, No. 1.

Robinson, J., et al. "Simultaneous Signature and Syndrome Compression," IEEE Transactions on Computer-Aided Design, May 1988, pp. 584-589, vol. 7, No. 5.

USPTO; Office Action dated Nov. 21, 2007, from related U.S. Appl. No. 11/096,293, filed Apr. 1, 2005.

USPTO; Office Action dated Jan. 13, 2010, from related U.S. Appl. No. 12/250,350, filed Oct. 13, 2008.

* cited by examiner

SYSTEMS AND METHODS FOR SIGNATURE CIRCUITS

RELATED APPLICATION

This application is a divisional application of U.S. patent application Ser. No. 12/250,350, filed Oct. 13, 2008, now abandoned, which is a divisional application of U.S. patent application Ser. No. 11/096,293, filed Apr. 1, 2005, now U.S. Pat. No. 7,437,641, issued on Oct. 14, 2008, which claims the benefit under 35 U.S.C. §119(e) of U.S. Provisional Application No. 60/558,713, filed Apr. 1, 2004, the disclosures of each of which are hereby incorporated by reference in their entireties herein.

BACKGROUND

1. Field of the Invention

The present invention is related to the testing of integrated circuits (ICs), including IC built in self tests (BISTs).

2. Description of the Related Art

Signature circuits are frequently used for detecting faults in integrated circuits. Test vectors are applied as test inputs to a circuit under test (CUT) or device under test (DUT). The monitored signals of the CUT are provided as inputs to a signature circuit. A conventional approach is to combine the monitored signals from the CUT with a stored value of the signature register (a "current" value) to create a new signature register value for each test vector is applied to the CUT. At the end of the set of test vectors, the contents of the signature register (i.e., the "signature") is compared to an expected signature for a fault-free circuit, which is typically calculated via a simulation. Fault coverage varies depending on the test vectors, the number of test vectors, the efficiency of the signature circuit, and the like. The percentage of fault coverage is the percentage of the total number possible single faults for which the resulting signature is different from that of a fault-free circuit. For example, the data, address, and control signals of a data bus in the CUT can be monitored as inputs for the signature circuit.

The combining of a monitored signal with a prior signature register value typically includes a mathematical operation. If multiple signals from the CUT are simultaneously provided as inputs to the signature register, the signature register is typically referred to as a Multiple Input Signature Register (MISR). One mathematical operation used with a MISR maintains a running odd-parity in each bit of the signature register of corresponding CUT signals. Other techniques combine multiple input signals and multiple signature register bits in some linear combination to create the next MISR state.

Generally, the greater the complexity of this operation, the better the fault coverage. More complex operations, however, can place limits on the speed at which the test vectors can be run. For example, each increase in the depth of the logic used to generate a new Multiple Input Signature Register (MISR) value increases the propagation delay to the input of the MISR's register. Also, if a circuit under test (CUT) signal is used as an input to multiple gates within the MISR, the MISR's multiple gates increase the capacitive load on that CUT signal with a corresponding decrease in the speed at which the CUT can operate, even under normal (non-test) operation. Hence, desirable considerations of MISR design include to achieve a high degree of fault coverage with a relatively small number of test vectors, to run test vectors at a relatively high clock rate, and to load the CUT lightly such that the CUT's performance is unimpaired during normal (non-test) operation.

Another consideration for Multiple Input Signature Register (MISR) design is that the larger the MISR circuit, the greater the likelihood of the MISR circuit's own susceptibility to faults. The can result in a decreased yield of otherwise good ICs due to faults occurring within the MISR. Of course, larger MISR circuits also increase the die size of the IC, which also impacts cost. For these reasons, the smaller the MISR circuit, the better.

Conventional Multiple Input Signature Registers (MISRs) perform a linear operation on a combination of the inputs to the MISR and the MISR's current state values to create the next MISR state. In the art, MISRs are also referred to as signature space compactor circuits since MISRs produce a signature with relatively few bits at the end of many test vectors rather than having, for example, a different signature per test vector. This should not be confused with compactors used to compress the size of a test vector generator circuit or ROM table.

One conventional space compaction technique uses multi-level logic that combines the monitored circuit under test (CUT) signals to form a single bit value per test vector. The signature is the resulting stream of values (which may then undergo additional compaction through a "time compaction" circuit such as a run-length coder such as a Ziv-Lempel code). See K. Chakrabarty and J. P. Hayes, "Test Response Compaction Using Multiplexed Parity Trees," *IEEE Trans. Computer-Aided Design*, vol. 15, pp. 1399-1408, November 1996.

According to one conventional Multiple Input Signature Register (MISR) technique, the signals from the circuit under test (CUT) are provided as inputs to logic that combines these signals with one of the current MISR register outputs. See U.S. Pat. No. 5,938,784 to Kim, in which a single register output of the MISR is fed back to create a primitive polynomial generator.

Another example is shown in FIG. 10.17 of M. Abramovici, et. al., *Digital Systems Testing and Testable Design*, Computer Science Press/W.H. Freeman, New York, N.Y., 1990, pp. 446. FIG. 1 illustrates such a MISR with $D_i$ representing the data inputs to the MISR from monitored signals of the CUT, and $C_i$ representing coefficients of a generator polynomial. The "+" in FIG. 1 indicates an exclusive-OR (XOR) operation. The coefficients $C_i$ operate such that a connection is provided when $C_i=1$ and no connection when $C_i=0$, i.e., logical ANDing by C. An output of a single register, the right most register (D-type flip-flop) in FIG. 1, is provided as an input to the logic gates implementing the generator polynomial, and the result is XOR'd with the monitored signals. One disadvantage to this approach is that the register driving the logic gates for the generator polynomial is loaded relatively heavily, which can slow down the rate at which the signature circuit operates. Abramovici notes that the probability of an undetected fault is $2^{-n}$ for an n-bit MISR.

SUMMARY

Test vectors are provided as inputs to a circuit under test (CUT). A signature circuit stores a "signature" based on a combination of signals from the circuit under test and a previous stored state of the signature register. Faults can be determined by detecting variances from an expected signature.

One embodiment includes a signature circuit in a diagonal bit-interleaved parity (BIP) configuration. Advantageously, each of the outputs from a signature register is provided as an input to one input stage of another register. In one embodiment, an output from each register is provided as an input to one XOR gate coupled to an input of one other register for determining the next state for the signature circuit. This reduces the load on a single register of the signature register.

One embodiment includes a signature circuit that generates a signature based upon the application of a first type of check symbol code or error detection code, where the first type of code is the result of a form of bit-interleaved parity (BIP) and applies a second type of check symbol code, such as a weight-based code, different from the first type of check symbol code as a check of the results of the first code. In one embodiment, the second type of check symbol code corresponds to a Bose-Lin check symbol (CS) code. For the same number of signature register bits, the combination of multiple check symbol codes of varying types advantageously provides fault detection that exceeds the capabilities of either fault detection code by itself.

One embodiment includes a signature circuit that includes a Multiple Input Signature Register (MISR) and a second type of check symbol generator, such as a Bose-Lin check symbol (CS) generator.

One embodiment includes a signature circuit that includes a diagonal bit-interleaved parity (BIP) check symbol (CS) generator and a binary counter, such as a 2-bit binary counter. Outputs of the diagonal BIP CS generator and the binary counter are used together for the "signature" of the signature circuit.

One embodiment includes a signature circuit that includes a Multiple Input Signature Register (MISR) and a binary counter, such as a 2-bit binary counter. Outputs of the MISR and the binary counter are used together for the "signature" of the signature circuit.

One embodiment includes a method of testing a circuit, where the method includes: resetting registers of a signature circuit, wherein states stored in the registers correspond to a signature of the circuit under test for a set of test vectors; applying test vectors to the circuit under test; monitoring selected signals from the circuit under test; updating states of registers of the signature circuit, where an updated state of a register is at least partially based on a combination of one or more monitored signals and a prior state of another register, and where outputs from at least two registers are used in updating the signature circuit; and comparing the resulting signature to an expected signature. In one embodiment, each output from each register of the signature circuit is provided as an input to one input stage, such as one XOR gate, of only one other register to update the signature.

One embodiment includes a method of testing a circuit, where the method includes: applying test vectors to the circuit under test; monitoring selected signals of the circuit under test; generating a first error detection code at least partially based on the monitored signals; and generating a second error detection code as a check for the first error detection code, where the second error detection code is a different type of error detection code than the first error detection code. In one embodiment, the first error detection code is a parity type of error detection code and the second error detection code corresponds to a weight-based code.

One embodiment includes a method of testing a circuit, where the method includes: applying test vectors to the circuit under test; monitoring selected signals of the circuit under test; generating a first error detection code at least partially based on the monitored signals; and generating a second error detection code as a check for the first error detection code by counting occurrences of one of logical "0" or "1" in a selected bit of the first error detection code.

One embodiment includes a signature circuit including: a means for monitoring selected signals of a circuit under test; a means for generating a first error detection code at least partially based on the monitored signals; and a means for generating a second error detection code as a check for the first error detection code, where the second error detection code is a different type of error detection code than the first error detection code. In one embodiment, the means for generating the first error detection code is configured to generate a parity type of code and the means for generating the second error detection code is configured to generate a weight-based code.

BRIEF DESCRIPTION OF THE DRAWINGS

These drawings and the associated description herein are provided to illustrate embodiments and are not intended to be limiting.

DETAILED DESCRIPTION OF EMBODIMENTS

Although particular embodiments are described herein, other embodiments, including embodiments that do not provide all of the benefits and features set forth herein, will be apparent to those of ordinary skill in the art.

Test vectors are applied as inputs to a circuit under test (CUT). A signature circuit stores a "signature" for the circuit under test based on a combination of signals from the circuit under test in response to test vectors and a previous stored state of the signature register. Faults can be determined by detecting variances from an expected signature. Embodiments of the invention advantageously provide relatively good fault detection coverage, with relatively small loads on the CUT, and operate at relatively high speed for relatively efficient testing.

A signature circuit monitors a set of signals within an integrated circuit (IC) while the circuit under test (CUT) is exercised by a set of test inputs (test vectors). A set of monitored IC signals provides the input to the signature circuit. It should be noted that the set of monitored IC signals do not have to correspond to specific outputs of the signature circuit. For example, address lines, internal data signals, internal status signals, and the like can also be monitored.

A signature circuit is typically implemented as a state machine in which the next state of the machine is a function of the current state and input signals to the signature circuit. The signature circuit state machine is initialized at the beginning of the test, such as by clearing of the registers, prior to application of the test vectors to the circuit under test (CUT). At the end of the test, the value stored in the state machine register of the signature circuit, i.e., the signature register, corresponds to the "signature" for the CUT. This value is compared to an expected value for a fault-free signature. A fault in the CUT should lead to a signature other than the signature for a fault-free circuit. The percentage of faults that can be detected by the signature circuit is referred to as the fault coverage of that test vector set over the CUT.

Diagonal Bit-Interleaved Parity (BIP) BIST Circuit

Figure 2:
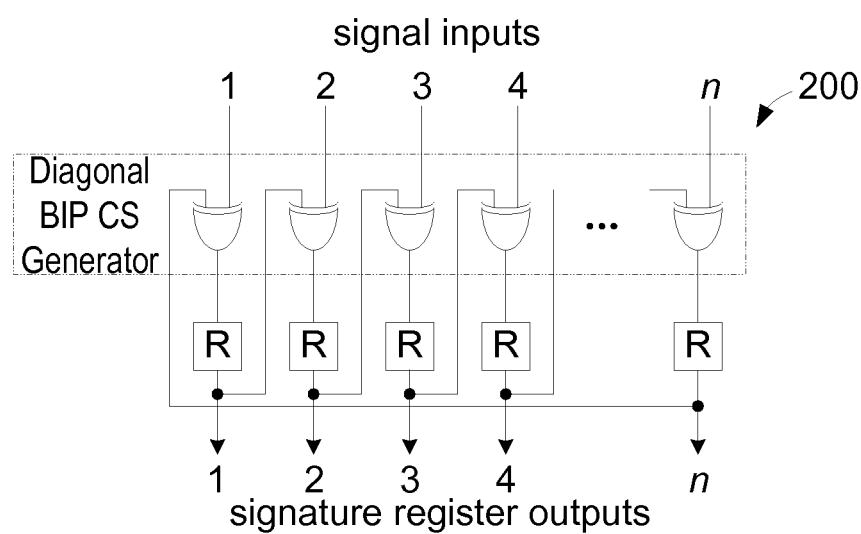
FIG. 2 illustrates an embodiment of a signature circuit in a diagonal bit-interleaved parity (BIP) configuration.

FIG. 2 illustrates an embodiment of a signature circuit 200 in a diagonal bit-interleaved parity (BIP) configuration. For bit-interleaved parity (BIP), monitored signals are partitioned into sets of signals, and a separate parity check is calculated for each set of signals during the running of the test vectors. In the illustrated signature circuit 200, a diagonal BIP configuration is used. In the illustrated diagonal BIP configuration for the signature circuit 200, the parity check partition for a signal is alternated for each test vector such that each final signature register bit represents a parity over all of the monitored signals for a different fraction of the test vectors.

Registers R form the signature registers for the signature circuit 200. For example, the registers R can be formed from D-type flip flops (D-FFs). Outputs of the registers (signature register outputs) provide the state of the signature circuit 200. A value stored in the registers R upon the completion of a test cycle corresponds to the "signature" for the circuit for the particular test vectors used. Exclusive-OR (XOR) gates form the diagonal BIP check symbol (CS) generator by combining data from monitored signals (signal inputs) with a previously stored state of the registers R to form a new state. In the configuration illustrated in FIG. 2, inputs of an XOR gate are coupled to a single monitored input signal and to an output from a register, and the output of the XOR gate is coupled to a different register. An embodiment that will be described in greater detail later in connection with FIG. 3 describes combining multiple input signals for an XOR gate in addition to other details.

Figure 1:
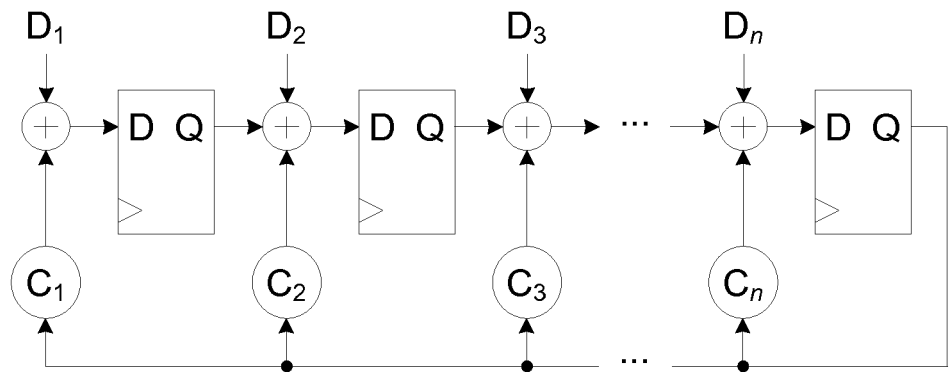
FIG. 1 illustrates a conventional Multiple Input Signature Register (MISR) circuit.

In contrast to the conventional MISR circuit illustrated in FIG. 1, where the output of a single register is provided as an input to multiple registers of the generator polynomial circuit and as a result, loaded relatively heavily, embodiments according to the diagonal BIP configuration use the output of each register R as the input to only one other register bit to determine the next state for the signature circuit 200. This advantageously distributes the load among multiple registers so that the signature circuit 200 can operate at relatively high speeds, thereby speeding up test time and enhancing productivity. In the illustrated embodiment, an output of each register R is provided as an input to an XOR gate of another register R for determining the next state for the signature circuit. In one embodiment, the diagonal BIP configuration is hardwired, i.e., not implemented by configurable logic, to reduce the parasitic capacitance on an output of a register.

The described diagonal BIP configuration possesses several advantages. One advantage to the diagonal BIP configuration is that the logic used in the diagonal BIP CS generator can be relatively shallow, i.e., the monitored signals propagate through relatively few levels of logic before the result is clocked into the signature register. This reduces propagation delays and permits the diagonal BIP CS generator to operate at relatively high speeds. In the illustrated embodiment, another advantage is that each register R is loaded by only one XOR input rather than by multiple XOR inputs via a generator polynomial. This also permits the signature circuit 200 to operate at relatively high clock rates. Another advantage is that the circuit logic is relatively compact, thereby saving chip space, saving cost, and improving yield. Moreover, the fault coverage for the signature circuit 200 with diagonal BIP is relatively good, with the probability of detecting ($P_{DET}$) a stuck fault on any of the monitored input signals expressed by Equation 1.

$$P_{DET} = 1 - 2^{-n} \qquad \text{Equation 1}$$

In Equation 1, n corresponds to the number of bits in the signature. This detection performance is about the same as the performance of the typical Multiple Input Signature Register (MISR) circuit described earlier in connection with FIG. 1.

Signature Circuit with Bose-Lin Check Symbol (CS) Error Detection Code

Figure 3:
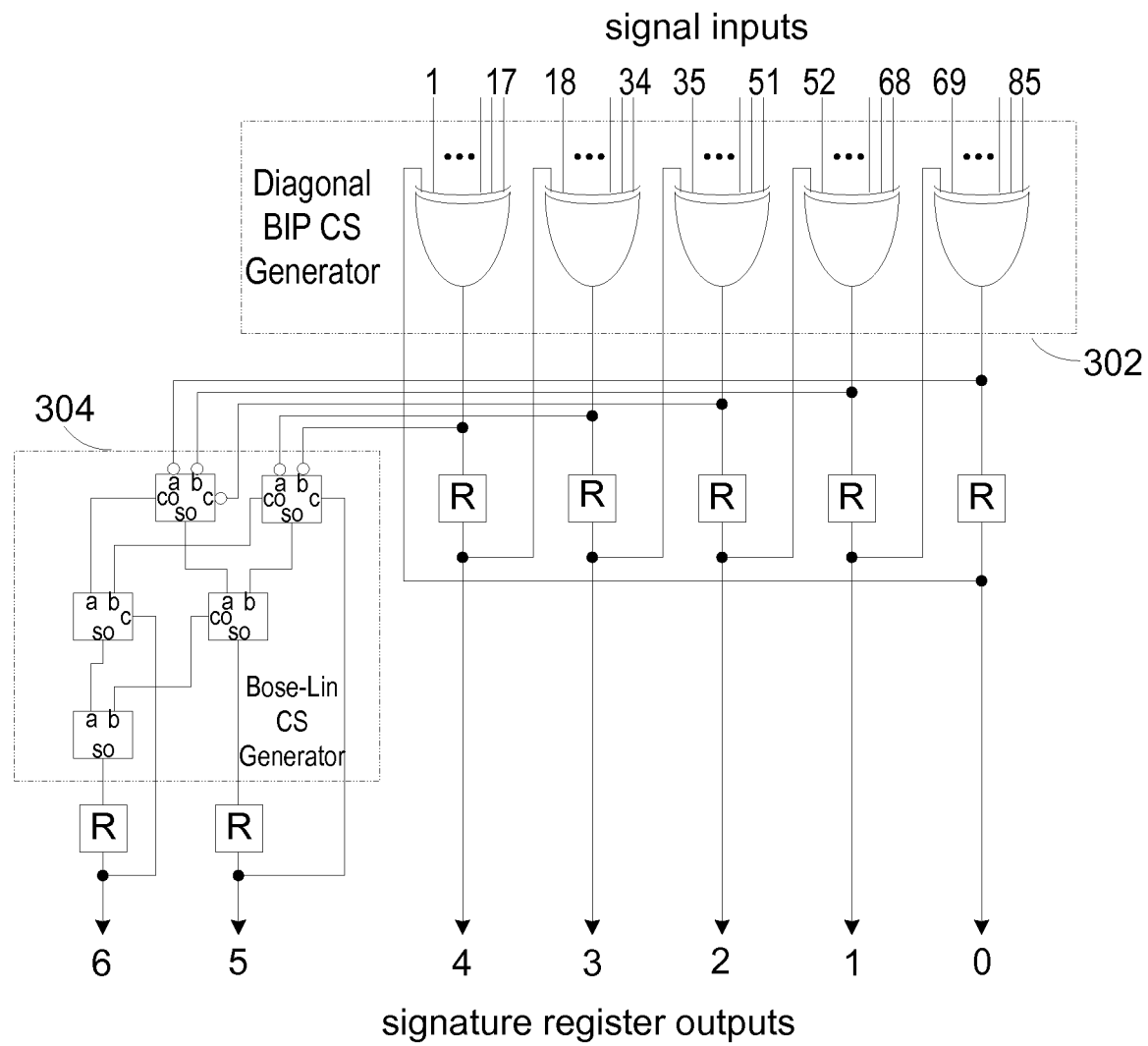
FIG. 3 illustrates an embodiment of a signature circuit with a generator for a Bose-Lin check symbol (CS) error detection code.

FIG. 3 illustrates an embodiment of a signature circuit with a generator for a Bose-Lin check symbol (CS) error detection code. The illustrated embodiment combines the parity-type of error detection code provided by a diagonal BIP CS generator 302 with a second type of error detection code. The second type of error detection code is preferably is not of the same type as the diagonal BIP, i.e., preferably not a parity code.

The diagonal BIP CS generator 302 includes a plurality of XOR gates. Outputs of each XOR gate are provided as inputs to corresponding registers R, which can be implemented by D-type flip flops. An output of each register R is coupled to an XOR gate of another D-type flip flop, thereby distributing the output load for the feedback path among multiple registers R. The diagonal BIP CS generator 302 monitors 85 input signals and generates 5 output bits in its signature registers (bits 0 to 4). In the illustrated example, multiple input signals are combined by the XOR gates. For example, input signals 1 to 17 can be combined by a multiple-input XOR gate. Outputs of the XOR gates are further monitored by the second type of error detection code. For example, the second type of error detection code used in the illustrated embodiment corresponds to a Bose-Lin code. The corresponding Bose-Lin check symbol (CS) generator 304 is advantageously compact for relatively low cost and high yield. It will be understood by the skilled artisan that other error detection codes will also be applicable and that modifications of the Bose-Lin code will also apply. For example, rather than counting zeroes for Bose-Lin coding, the circuit can count ones or a combination of both (zeroes for selected lines, ones for others) to generate weight-based coding.

The Bose-Lin check symbol (CS) generator 304 generates a Bose-Lin code of the monitored outputs of the XOR gates of the diagonal BIP CS generator 302. A Bose-Lin code is a count of the number of data zeros ("0's") in the information word, with the count taken with a pre-specified modulo. In the illustrated signature circuit, the information word corresponds to the output of the diagonal BIP CS generator 302. For example, a 2-bit Bose-Lin code corresponds to the count of the number of zeroes modulo 4. In the illustrated embodiment, the data for output bits 5 and 6 of the signature register are from the Bose-Lin check symbol (CS) generator 304.

For counting a relatively large information word, it can be impractical to implement an adder array for computation of the Bose-Lin code. For example, were the diagonal BIP CS generator to be modified to increase the number of corresponding output bits, the adder array for implementation of the Bose-Lin CS generator can be too large to be practical. Such a large adder would likely be ill-suited for the desired speed and circuit size criteria. For example, the adder array would be relatively large and deep, or a relatively larger number of input signals would need to be grouped together in XOR arrays, which also increases the logic size and depth.

The use of Bose-Lin codes or similar weight-based codes as a second type of error detection code is unusual in this application. Bose-Lin codes are optimized and typically used for unidirectional errors. Unidirectional errors are those in which all errors are either 0-to-1 or 1-to-0, but not both within the data block covered by a particular code. If both 0-to-1 and 1-to-0 errors occur within the same data block, these errors are described as bi-directional. Unidirectionality of errors for inputs that are provided to the Bose-Lin CS generator are not guaranteed at the outputs of a diagonal BIP CS generator. It should be noted that in the presence of bi-directional errors, a Bose-Lin code will only fail to detect a fault when it produces a difference in the number of "0's" in the data block such that this difference is equal to a multiple of the code's modulo. The most common case of undetectable errors should be when the multiple is zero, i.e., there are an equal number of 0-to-1 and 1-to-0 errors within the data block.

Binary Counter Implementation

Figure 4:
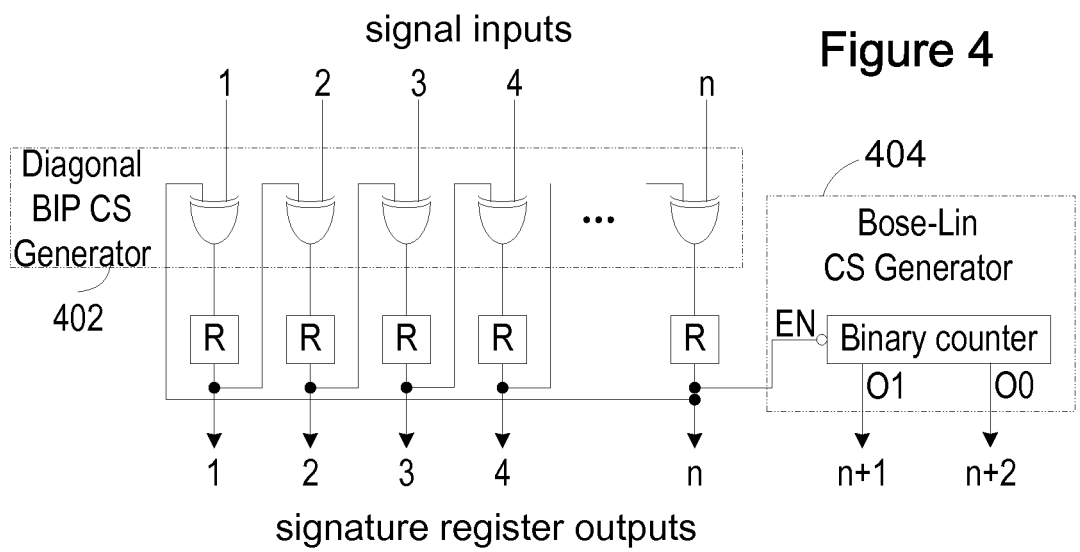
FIG. 4 illustrates an embodiment of a signature circuit with a diagonal bit-interleaved parity (BIP) configuration and a generator for a Bose-Lin check symbol (CS) error detection code.

FIG. 4 illustrates an embodiment of a signature circuit with a diagonal bit-interleaved parity (BIP) generator 402 and a generator 404 for a Bose-Lin check symbol (CS) error detection code. In the illustrated embodiment, the Bose-Lin CS generator 404 is efficiently implemented with a 2-bit binary counter. A 1-bit binary counter would not be suitable as it would correspond to parity. Binary counters of 3-bits or more can be used, but at the cost of diminishing returns relative to increased counter complexity.

The implementation with the binary counter is advantageously compact, especially for relatively large numbers of signature register output bits. The binary counter implementation takes advantage that it is not necessary to perform the check using the second type of error detection code over an entire diagonal BIP CS generator in parallel. With a diagonal BIP, such as the diagonal BIP generator 402, the results of each bit are effectively rotated through the corresponding registers. A Bose-Lin encoder can be implemented by a binary counter producing a count of the number of zeros that appear at the output of a single register stage over the course of set of test vectors. In the illustrated embodiment, the output of the n-th register R is used as an input to the enable input of the binary counter of the Bose-Lin CS generator 404. However, it should be noted that the output of any of the registers R can be used.

In addition, it should be noted that while the binary counter is enabled in the illustrated embodiment when the output of the n-th register is low or logic "0" to correspond to the Bose-Lin check symbol, that a check symbol can also be generated using the opposite polarity, i.e., counting ones. However, it should be noted that this "counting ones" configuration would not be called a Bose-Lin check symbol.

For this signature register application, the Bose-Lin code and similar codes have an advantage of using a different method than the primary code, i.e., the diagonal BIP, which uses a parity check. The binary counter implementation is also relatively simple and compact to implement because a serial input can be used. For faults that affect the signals on only one of the circuit under test (CUT) outputs to the signature register R block, this serial implementation is functionally and mathematically equivalent to applying the Bose-Lin code to all of the signature register R inputs. That is, the effects will be rotated into the Bose-Lin coder so that each individual effect is typically observed by the Bose-Lin coder. When a fault affects multiple CUT inputs to the signature register, the performance of the circuits in FIGS. 3 and 4 can be equivalent. An example of such a fault is an application where the CUT inputs are an address/data bus and a fault in the logic of a processor causes it to jump to the wrong area of memory for its instructions. Equation 2 expresses the probability of the Bose-Lin CS generator 404 not detecting changes on the inputs from the CUT.

$$P_{det:B-L} = 1 - \left[ \sum_{i=1}^{n/2} \binom{n}{2i} \binom{2i}{i} + \sum_{k=1}^{2i/MOD} \binom{2i}{(2i-(j)(MOD))/2} (2) \right] \left( \frac{1}{3^n} \right)$$

Equation 2

Because the Bose-Lin code should observe the change from a fault before it is effectively masked by a subsequent input to the diagonal BIP resulting from the circuit under test (CUT) fault, the Bose-Lin detection capability is effectively independent from the diagonal BIP. It can be strictly independent if the fault affects only one of the inputs. Hence, the probability of detecting a fault is approximately the product of the diagonal BIP and Bose-Lin detection probabilities. Simulations indicate that Equation 2 approaches 0.01 for test vector sets with several hundred vectors, so it follows that the probability of detecting a fault with the signature circuit of FIG. 4 is expressed by Equation 3.

$$P_{DET} \approx 1-(0.01)(2^{-n})$$

Equation 3

As illustrated by Equation 3, adding a 2-bit Bose-Lin CS generator as described in connection with FIG. 4 advantageously decreases the probability of undetected faults by about two orders of magnitude. It will be observed that the configuration illustrated in FIG. 4 adds two bits to the signature register outputs so that the total number of signature register outputs is n+2.

Figure 5:
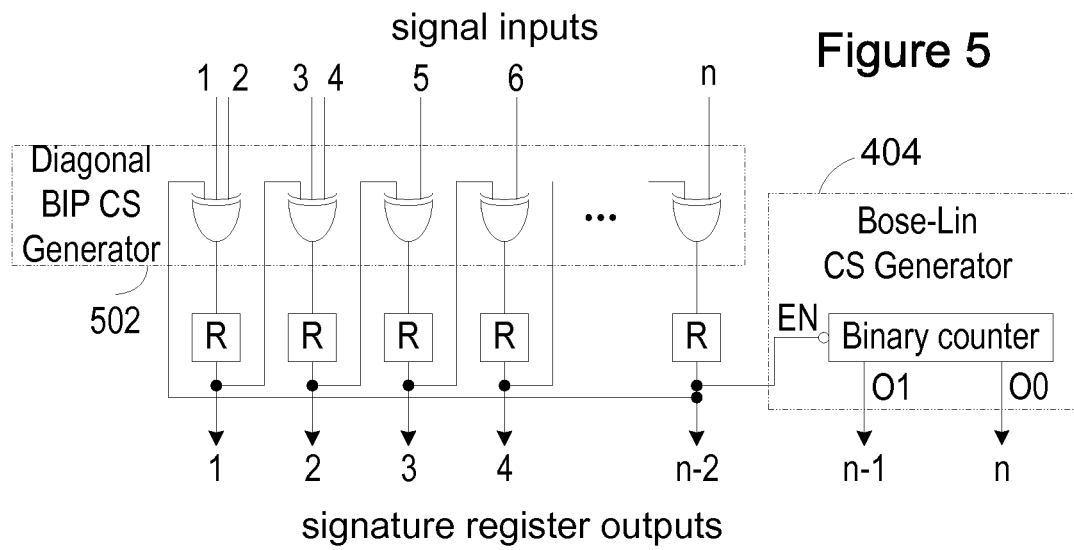
FIG. 5 illustrates an embodiment of a signature circuit with a diagonal bit-interleaved parity (BIP) configuration, a generator for a Bose-Lin check symbol (CS) error detection code, and having reduced output bits.

FIG. 5 illustrates where output bits have been dropped from the diagonal BIP CS generator 502 to accommodate the bits used by the Bose-Lin CS generator 404. For example, where having a signature circuit with fewer bits is desired, such as less than or equal to the same number of bits as the number of monitored signals from the circuit under test (CUT), the two or more additional bits used by the Bose-Lin error detection code or similar code can be included at the expense of dropping two or more bits from the diagonal BIP by merging some of the inputs from the CUT at common XOR gates. In the illustrated embodiment of FIG. 5, bits 1 and 2 are merged into a first XOR gate, and bits 3 and 4 are merged into a second XOR gate. The probability of undetectable faults with this circuit is expressed by Equation 4. The difference between the undetected fault probability of the original diagonal BIP performance of FIG. 4 and that of FIG. 5 is about $(0.01)(2^2) = 0.04$.

$$P_{DET} \approx 1-(0.01)(2^{-n+2})$$

Equation 4

It should be noted that a Bose-Lin coder can also be added to the conventional Multiple Input Signature Register (MISR) to increase performance. For example, an output of a register, such as an output of the last D-FF to the right of FIG. 1, can be coupled to an enable input of a binary counter implementing a Bose-Lin coder or similar coder. However, it should be recalled that one advantage of the diagonal BIP over the MISR is the lower loading on the feedback signal(s), which permits potentially higher clock rates during built-in self test.

Example Applications and Embodiments

Figure 6:
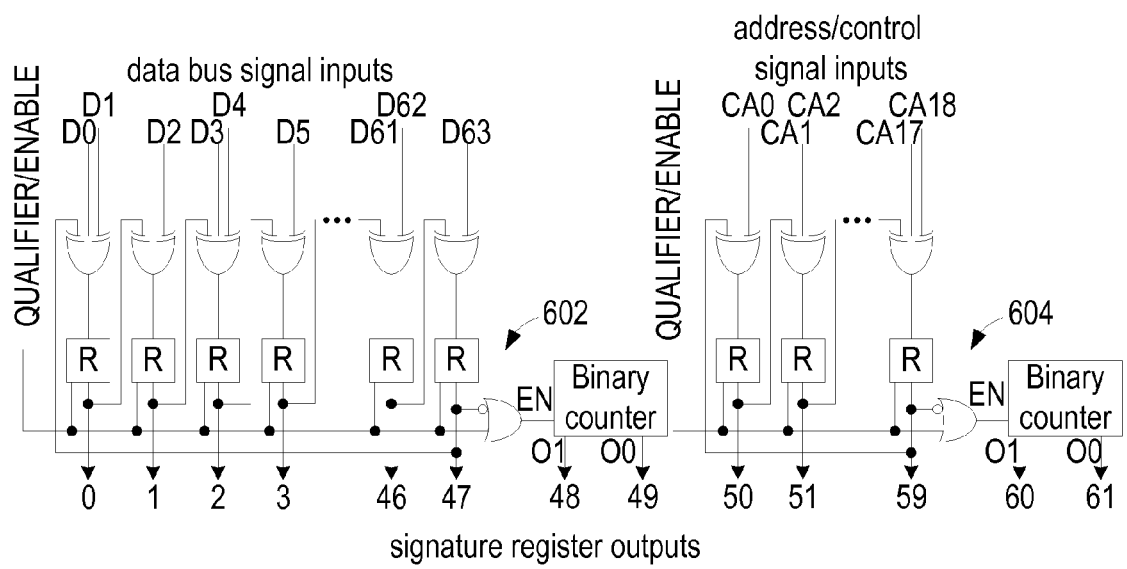
FIG. 6 illustrates a detailed example of an embodiment of a signature circuit with 64 data bits monitored, with 19 address or control bits monitored, and with 62 signature register outputs.

FIG. 6 illustrates an example of an application for an embodiment of the invention. In this example, the signature circuit is used to monitor an internal bus in a system-on-chip integrated circuit. The signature circuit monitors the states of the address and data buses, and their associated control signals, for an embedded processor. The signature circuit should be capable of detecting any faults on these bus and control lines, and should also be able to detect any faults within the processor, or other circuits with which it communicates over the bus, that result in at least one different or unexpected value appearing on the bus during the course of the test. Appropriately written test vectors should lead to such different values appearing on the bus for faulty circuits. In the illustrated application, there is no need to have the signature circuit contain fewer bits than the number of bits in the data bus, which is typically the same as the internal register width.

As illustrated in FIG. 6, the data bus (D0:D63) is monitored by a first set of diagonal BIP and Bose-Lin check symbol circuits 602 while the address and control lines (CA0:CA18) are monitored by a second set 604. In order to reduce the 85 monitored input signals to 64 bits or less, selected monitored inputs have been combined in pairs as inputs to the diagonal BIP XOR gates. For example, monitored inputs D0 and D1 have been combined. The qualifier/enable inputs allow the signature circuit to be enabled only during relevant portions of the test vectors and allow it to hold its current value at the end of the test (or at intermediate points in the test where its value may also be checked). A reset signal (not shown) initializes the signature register to a known state at the beginning of the test.

While virtually any signature implementation will be able to detect a single bus value difference over the course of the test vectors, it is relatively difficult to detect faults that change a large number of values. For example, if a fault causes the processor to jump to the wrong section of memory for its instructions, there would be a very large change to the values appearing on all bus signals over the course of the test vectors.

Figure 7:
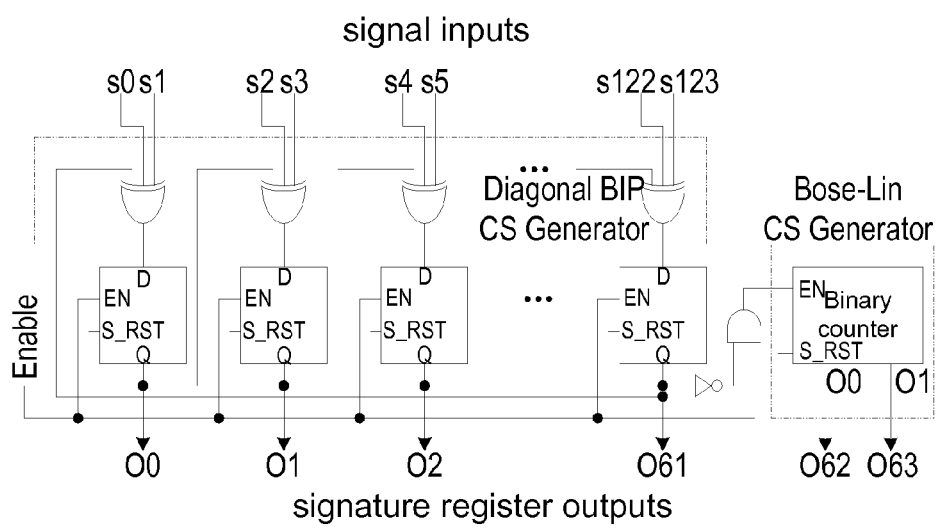
FIG. 7 illustrates a detailed example of an embodiment of a signature circuit with 124 signals, and with a 64-bit signature formed by the signature circuit.

FIG. 7 illustrates another example of an application for an embodiment of the invention. In the illustrated embodiment, a signature circuit comprising a diagonal BIP check symbol generator circuit and a Bose-Lin check symbol circuit is used to monitor 124 signals (S0:S123). The signature circuit output uses 64 bits (O0:O63). The first 62 bits (O0 to O61) are outputs of the diagonal BIP check symbol generator. The remaining two bits (O62 and O63) are outputs of the Bose Lin check symbol circuit. In addition, the schematic of FIG. 7 illustrates reset inputs on the D-type flip-flops and the binary counter for resetting of the signature circuit.

Embodiments of the invention advantageously reduce IC cost. By improving the fault detection capability of the test circuit, a smaller number of test vectors may be used, reducing the cost of the factory tests that verify whether the IC is good. The relatively shallow logic of the disclosed embodiments also reduces the impact of the test circuits on the clock rate at which the test vectors can be run, which can result in further decreases in testing time. The compact circuit size reduces the impact of the test circuit on the die size. Increased fault coverage also reduces the probability that the IC will be returned by the customer due to a defect that was not detected during test.

Various embodiments have been described above. Although described with reference to these specific embodiments, the descriptions are intended to be illustrative and are not intended to be limiting. Various modifications and applications may occur to those skilled in the art without departing from the true spirit and scope of the invention as defined in the appended claims.

What is claimed is:

1. A signature circuit comprising:
   a check symbol generator circuit in communication with a circuit under test (CUT), wherein the check symbol generator circuit is configured to generate an error detection code as an output, wherein the error detection code forms a first portion of a signature for the signature circuit; and
   a binary counter coupled to at least one signal line of the check symbol generator circuit, wherein the binary counter is enabled to count either of a logical "0" or a logical "1" state of the at least one signal line, and wherein the count maintained by the binary counter forms a second portion of the signature for the signature circuit.

2. The signature circuit as defined in claim 1, wherein the binary counter comprises a 2-bit binary counter.

3. The signature circuit as defined in claim 1, wherein the binary counter is enabled for the logical "0" and disabled for the logical "1" such that the count corresponds to a Bose-Lin code.

4. The signature circuit as defined in claim 1, wherein the check symbol generator circuit corresponds to a parity type of check symbol generator circuit.

5. The signature circuit as defined in claim 1, wherein the check symbol generator circuit corresponds to a diagonal bit-interleaved parity (BIP) circuit.

6. The signature circuit as defined in claim 1, wherein the check symbol generator circuit corresponds to a Multiple Input Signature Register (MISR) circuit.

7. A method of testing a circuit, the method comprising:
   applying test vectors to the circuit under test;
   monitoring selected signals of the circuit under test;
   generating an error detection code at least partially based on the monitored signals, wherein the error detection code forms a first portion of a signature for a signature circuit; and
   controlling a binary counter coupled to at least one signal line of the check symbol generator circuit, wherein the binary counter is enabled to count either of a logical "0" or a logical "1" state of the at least one signal line, and wherein the count maintained by the binary counter forms a second portion of the signature for the signature circuit;
   wherein at least monitoring, generating, and controlling are performed by hardware.

8. The method as defined in claim 7, wherein the binary counter comprises a 2-bit binary counter.

9. The method as defined in claim 7, wherein the binary counter is enabled for the logical "0" and disabled for the logical "1" such that the count corresponds to a Bose-Lin code.

10. The method as defined in claim 7, wherein the error detection code corresponds to a parity type of check code.

11. The method as defined in claim 7, wherein the error detection code corresponds to a diagonal bit-interleaved parity (BIP) type of check code.

12. The method as defined in claim 7, wherein the error detection code corresponds to an output of a Multiple Input Signature Register (MISR).

* * * * *